United States Patent [19]

Appelbaum et al.

[11] 4,026,653
[45] May 31, 1977

[54] PROXIMITY PRINTING METHOD

[75] Inventors: Jacob Appelbaum, North Plainfield; Martin Feldman, Murray Hill, both of N.J.

[73] Assignee: Bell Telephone Laboratories, Incorporated, Murray Hill, N.J.

[22] Filed: May 9, 1975

[21] Appl. No.: 576,099

[52] U.S. Cl. .............................. 355/132; 355/76; 355/77; 355/91

[51] Int. Cl.² .................................. G03B 27/02

[58] Field of Search .............. 355/72, 73, 76, 91, 355/94, 125, 132, 133, 77

[56] References Cited

UNITED STATES PATENTS

| 1,209,419 | 12/1916 | Farguhar | 355/73 |
|---|---|---|---|
| 3,103,850 | 9/1963 | Khoury et al. | 355/76 X |
| 3,151,521 | 10/1964 | Atkin et al. | 355/77 X |
| 3,204,544 | 9/1965 | Shannon | 355/133 |
| 3,519,348 | 7/1970 | McLaughlin | 355/133 |
| 3,619,056 | 11/1971 | Hantusch et al. | 355/73 X |
| 3,676,002 | 7/1972 | Moreau et al. | 355/133 |
| 3,741,650 | 6/1973 | Leavitt et al. | 355/91 |
| 3,771,872 | 11/1973 | Nightingale et al. | 355/133 X |

OTHER PUBLICATIONS

Schaible, P. M., "Dimension Control of Photolithographically Produced Patterns," I.B.M. Technical Disclosure Bulletin, vol. 8, No. 11, April 1966, p. 1575.

Primary Examiner—Fred L. Braun
Attorney, Agent, or Firm—Roderick B. Anderson; Lucian C. Canepa

[57] ABSTRACT

A predetermined small spacing or gap between a semiconductor wafer and a mask is defined by projecting a cushion of air through a central mask aperture toward the wafer. The wafer is supported on a sponge rubber member which is designed, along with the air flow paths, to maintain a uniform small separation as is desirable in the photolithographic printing of semiconductor mask patterns.

6 Claims, 1 Drawing Figure

U.S. Patent May 31, 1977 4,026,653
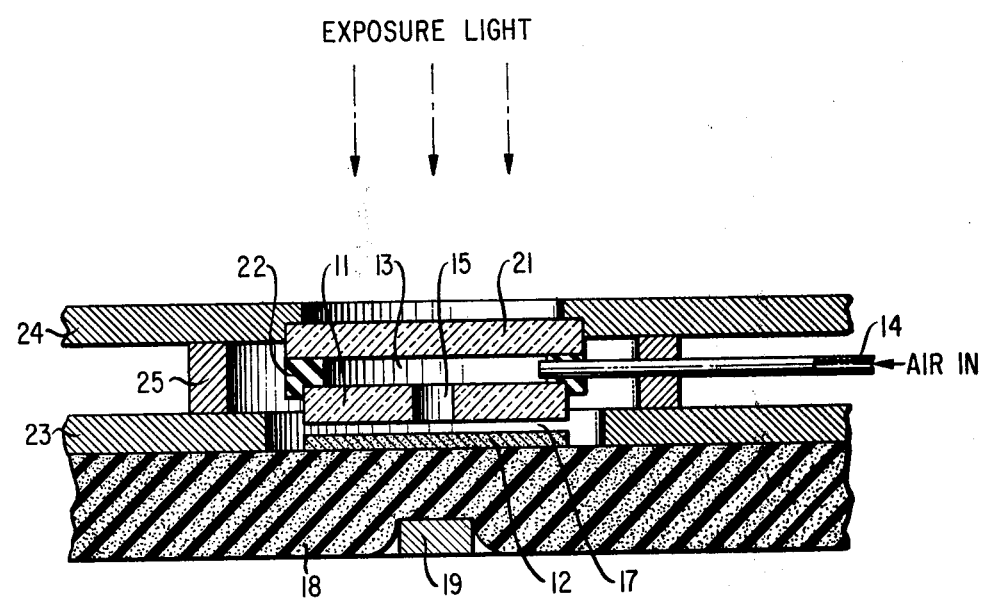

PROXIMITY PRINTING METHOD

BACKGROUND OF THE INVENTION

This invention relates to proximity printing, and more particularly, to the photolithographic printing of mask patterns representative of electronic circuit elements on photosensitized semiconductor wafers.

The fabrication of semiconductor integrated circuits requires the repeated projection of light through different masks onto a semiconductor wafer coated with a photosensitive film. After each exposure and appropriate development and etching, the film itself then constitutes a mask for selective processing of the wafer such as diffusion, metallization or etching.

The three principal techniques for such photolithographic printing are contact printing, in which the mask is in physical contact with the film; projection printing, in which an image of the mask is projected onto the film; and proximity printing, in which a small gap is maintained between the mask and the wafer as is desirable for avoiding damage to mask and thereby extending mask lifetime. Good resolution resulting in accurate exposure of the fine details used in modern photolithographic masks requires that this gap be maintained within stringent uniformity tolerances. This gap is presently established by any of various forms of fixed spacers. Such spacers almost invariably give a slightly nonuniform support of the mask over the wafer, resulting in slight nonuniformities in the separation gap. Also, inherent deviations from flatness by the semiconductor wafer and mask surfaces are a prime source of gap nonuniformities.

SUMMARY OF THE INVENTION

Accordingly, it is an object of this invention to provide an improved technique for establishing the small predetermined gap between mask and wafer required in proximity printing.

This and other objects of the invention are obtained in an illustrative embodiment thereof which is described briefly in the Abstract of the Disclosure.

In accordance with this embodiment, the sponge rubber member is used to provide a spring bias to the semiconductor wafer which forces the coated surface of the wafer toward the mask. By directing air through a central aperture in the mask, the wafer is forced away from the mask against the spring bias and a uniform gap is established. The oppositely directed forces of the spring bias (sponge rubber) and the air flow inherently flatten out the wafer to further ensure gap uniformity.

Our experiments have shown that other modifications can be made to provide even further improvements in the gap accuracy that can be obtained. For example, while directing air through the center of the mask inherently results in a radial flow along the wafer surface, the resulting downward forces tend to concentrate at the center of the wafer. To offset this characteristic, the sponge rubber member may be rested or supported on a small rigid protrusion beneath the center of the wafer which provides added upward spring bias on the central portion of the wafer. A steel annular ring may surround the wafer so as to avoid undesirable stress components in the sponge rubber member that create nonuniformities or are transverse to the oppositely directed force components bearing on the wafer.

In order that the air duct does not obscure the exposure light in printing, a transparent air chamber above the mask, opposite the wafer, may be provided through which the required air flow may be directed.

These and other objects, features and advantages of the invention will be better understood from a consideration of the following detailed description taken in conjunction with the accompanying drawing.

BRIEF DESCRIPTION OF THE DRAWING

The drawing shows an illustrative embodiment of the invention in which a cushion of air is provided for separating a photolithographic mask from a semiconductor wafer.

DETAILED DESCRIPTION

Referring now to the drawing, there is shown a proximity printing system in which a photolithographic mask 11 is displaced a small distance from a semiconductor wafer 12 coated with a photosensitive film. Exposure light, shown schematically by the arrows, is directed through the mask 11 to expose selectively certain portions of the photosensitive film thereby to print the mask pattern on the semiconductor wafer as is known in the art.

In accordance with the invention, a sealed air chamber 13 is provided along the surface of the mask 11 opposite the semiconductor wafer and air is directed into this chamber under pressure via an air duct 14. A central aperture 15 in the mask 11 causes the air pressure to exert a force against the wafer 12, thereby establishing a highly predictable and uniformly small gap 17 between the mask and wafer as is required in proximity printing.

The wafer 12 is supported on a sponge rubber member 18 which inherently exerts an upward spring bias on the wafer in opposition to the air pressure force. It has been found that any good quality, relatively fine-graded sponge rubber inherently exerts a relatively uniform mechanical spring bias in this manner.

It has been found that a simple way of providing the kind of air cushion required for establishing uniform gap is by directing air through the center of the mask, as shown. This tends, however, to create a distribution of air pressure forces which is relatively concentrated at the center of the circular wafer. Depending on the accuracies required, this may not be a problem, but compensating forces may be applied by providing a rigid protrusion 19 on the side of the sponge rubber member opposite the center of the semiconductor wafer 12. It has been found experimentally that this gives a slightly increased flatness to the semiconductor wafer, with a resulting improved uniformity of the gap 17.

To provide structural rigidity, mask 11 preferably comprises a relatively thick glass member having on the surface facing the semiconductor wafer an appropriate opaque material such as chrome on which the pattern is formed. Because it is important that the exposure light be unobstructed, the air chamber 13 should be defined by a transparent member 21. The chamber 13 is also defined by an airtight annular seal 22 through which air duct 14 protrudes.

To provide further uniformity of opposing forces on the wafer 12, it is also preferred that a peripheral ring 23 be provided which bears forcibly on the sponge rubber member 18 and surrounds the semiconductor wafer 12. This ring and the air chamber 13 are preferably supported by a structural member 24 and the vertical location of the ring 23 is determined by a rigid annular spacer 25. The length of spacer 25 is preferably designed such that the lower surface of the peripheral ring 23 corresponds to the desired location of the lower surface of the wafer 12. Thus, when air is circulating through aperture 15, the peripheral ring 23 and wafer 12 will be exerting substantially uniform downward forces on the sponge rubber member, thereby avoiding the creation of spurious horizontal force components that might tend to distort the wafer. It should be emphasized, however, that neither the ring 23 nor the protrusion 19 are essential to the operation of the technique; rather, they have been found experimentally to provide a more uniform distribution of stresses within the sponge rubber layer, as is clearly desirable.

The air supplied by duct 14 may typically have a pressure of 5 to 10 pounds per square inch with a flow rate of about 1 liter per minute, which corresponds to an exit air velocity at the periphery of a two-inch diameter wafer of 5 meters per second, when the gap 17 is 20 to 40 microns. With a two-inch wafer, the diameter of the sponge rubber member 18 may be 4 inches; the thickness of the sponge rubber member may be one inch and the height of protrusion 19 may be ¼ inch. The wafer is typically 20 mils thick, the mask 11 ¾ inch thick, and member 21 ¼ inch thick. The gap distance may be monitored by interference techniques or, preferably, by metallizing the wafer and a mask portion and measuring the gap capacitance.

Although a full description of the air cushion would be unduly protracted, many of its features can be "explained" heuristically. We may expect the flow rate, F, to be proportional both to the input pressure, P, and the wafer to mask separation, D. Thus, $$F = KDP$$

where K is a constant. Keeping F fixed and differentiating, $$dD/dP = -D/P \approx 4 \text{ microns/psi.}$$

Experimentally this equation was approximately verified.

A wafer which is not flat effectively presents a range of separations, D. Consequently, at a given flow rate, different portions of the wafer are exposed to different pressures, with the higher pressure obtaining at the smaller separations. To estimate the effect of these pressure differentials, we exposed the middle 1.25 inches of a two-inch wafer to a pressure excess of 10 psi, and observed a total deformation of 250 microns. Thus, in this particular geometry, for the wafer $$dD/dP = 25 \text{ microns/psi.}$$

This is much larger than $dD/dP$ for the air cushion itself, implying that on a 1.25-inch size scale the wafer is comparatively flexible. Therefore, this again verifies that exposure of the wafer to the pressure gradients in the air cushion results in a substantially constant gap distance between the mask and wafer; in other words, the forces on the wafer vary with the distance between mask and wafer to make the flatness of the wafer conform to that of the mask.

In summary, we have disclosed a system for producing a predictably small uniform gap over a wafer several inches in diameter. Besides producing a uniform separation as required for reliable proximity printing photolithographic exposure, the system inherently causes the wafer to conform to the mask by subjecting it to counteracting stresses. Best operation requires at least one aperture in the mask, but this may have a diameter of one millimeter or less, and only occupy one chip site.

The embodiment described is intended to be merely illustrative of the concepts involved. Various other embodiments and modifications may be made by those skilled in the art without departing from the spirit and scope of the invention.

What is claimed is:

1. In a process for proximity printing a mask pattern on a photosensitive film, comprising the steps of displacing the mask a small distance from the film and projecting radiant energy through the mask to expose at least part of the film, the improvement wherein:
   the displacement step comprises the step of directing air between the mask and film to force apart the mask and film and establish a uniform and constant gap between the mask and film,
   and the air directing step comprises the step of directing air through at least one aperture in the mask toward the film.

2. The improvement of claim 1 wherein:
   the film constitutes a coating on a semiconductor wafer;
   and further comprising the step of applying a spring bias onto the wafer in the direction of the mask, thereby establishing a force on the wafer in opposition to the force produced by the directed air.

3. The improvement of claim 2 wherein:
   the step of applying a spring bias to the wafer comprises the step of supporting the wafer on a layer of sponge rubber.

4. The improvement of claim 3 wherein:
   the air directing step comprises the step of diverting air through a central aperture in the mask; and
   the step of applying the spring bias further comprises the step of supporting the sponge rubber layer on a rigid central protrusion, thereby to distribute the spring bias forces in the wafer to compensate for nonuniform force distribution resulting from the directed air.

5. The improvement of claim 4 wherein:
   the spring bias applying step further comprises the step of applying around the periphery of the semiconductor wafer a downward force on the sponge rubber layer, thereby to provide greater uniformity of oppositely directed forces on the wafer.

6. The improvement of claim 5 wherein:
   the mask constitutes part of a first transparent member having the aforesaid central aperture;
   and further comprising the step of supporting the first transparent member by a second transparent member substantially coextensive therewith which is located opposite the semiconductor wafer;
   and wherein the air directing step comprises the step of directing air between the first and second transparent members, whereby the air directing step does not obstruct said radiant energy.

* * * * *